United States Patent [19]

Henrickson et al.

[11] Patent Number: 4,661,981

[45] Date of Patent: Apr. 28, 1987

[54] METHOD AND MEANS FOR PROCESSING SPEECH

[76] Inventors: Larry K. Henrickson, 27A Terr. Ct., Los Gatos, Calif. 95030; Dorothy A. Huntington, 830 Escondido Rd., Stanford, Calif. 94305

[21] Appl. No.: 778,326

[22] Filed: Sep. 20, 1985

Related U.S. Application Data

[63] Continuation of Ser. No. 683,956, Dec. 19, 1984, abandoned, which is a continuation of Ser. No. 455,250, Jan. 3, 1983, abandoned.

[51] Int. Cl.$^4$ .............................................. G10L 5/00
[52] U.S. Cl. ........................................ 381/31; 381/68; 381/106
[58] Field of Search ................... 381/29, 47, 106, 110

[56] References Cited

U.S. PATENT DOCUMENTS

| | | | |
|---|---|---|---|
| 3,509,558 | 4/1970 | Cancro | 340/347 |
| 4,071,695 | 1/1978 | Flanagan et al. | 179/1 VL |
| 4,112,254 | 9/1978 | Blackmer | 381/106 |
| 4,169,219 | 9/1979 | Beard | 179/100.3 R |
| 4,249,042 | 2/1981 | Orban | 381/106 |

OTHER PUBLICATIONS

Braida et al. (1979), "Hearing Aids etc.", ASHA Monograph 19, Apr. 1979.
Braida et al. (1982) "Review of Recent Research ... for Hearing Impaired", MIT, 1982.
Robinsion et al., "The Intelligibility of Speech etc.", J. of Acoustical Soc. of Am., vol. 54, Nr. 1, 1973, p. 314.

Primary Examiner—E. S. Matt Kemeny
Attorney, Agent, or Firm—Flehr, Hohbach, Test, Albritton & Herbert

[57] ABSTRACT

A method of and apparatus for processing audio signals in which a measure of amplitude of audio signals in a selected time period is obtained. The audio signals for the selected time period are delayed until the measure of amplitude is obtained, and then the delayed audio signals are normalized using the measure of amplitude. High-frequency emphasis may be employed prior to obtaining the measure of amplitude. Alternatively, a multi-channel system can be employed for processing audio signals in limited frequency bands. The method and apparatus are applicable in a variety of applications including hearing aids, audio storage media, broadcast and public address systems, and voice communications such as telephone systems.

1 Claim, 5 Drawing Figures

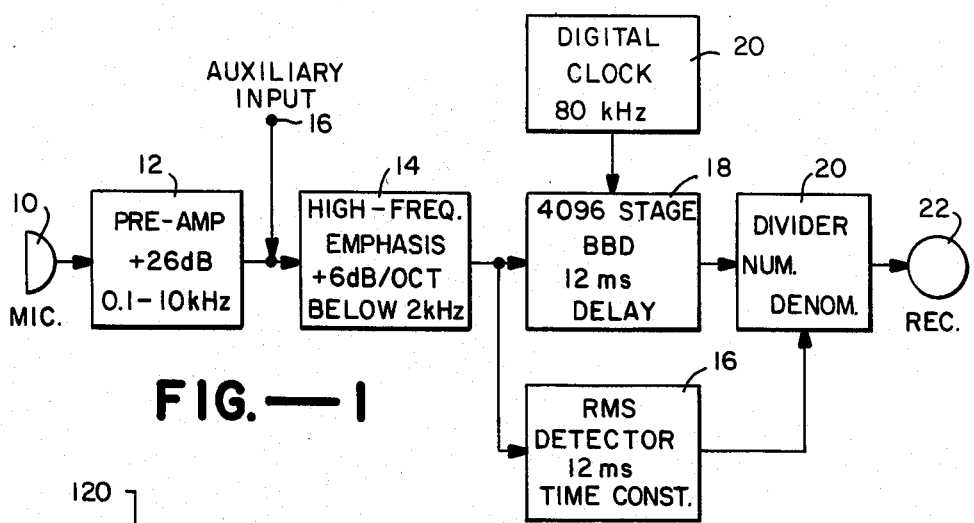
FIG.—1
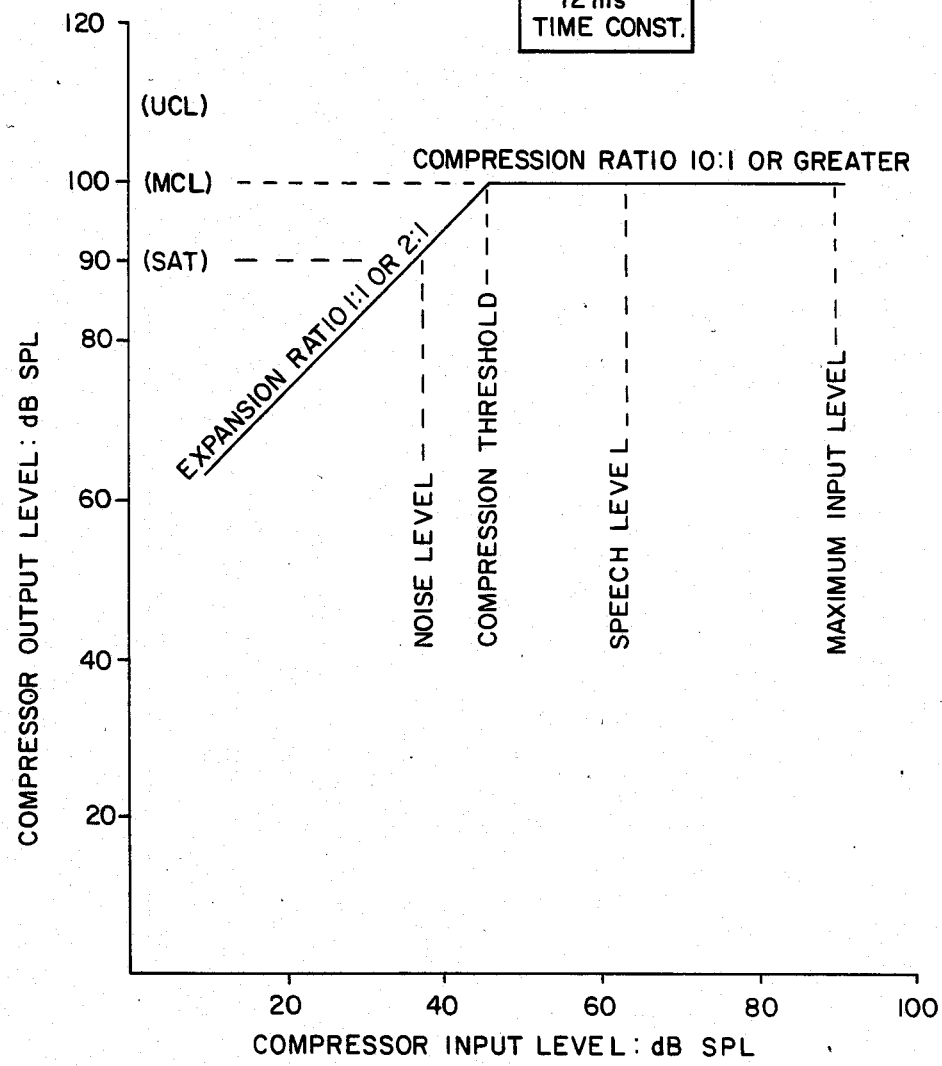
FIG.—2

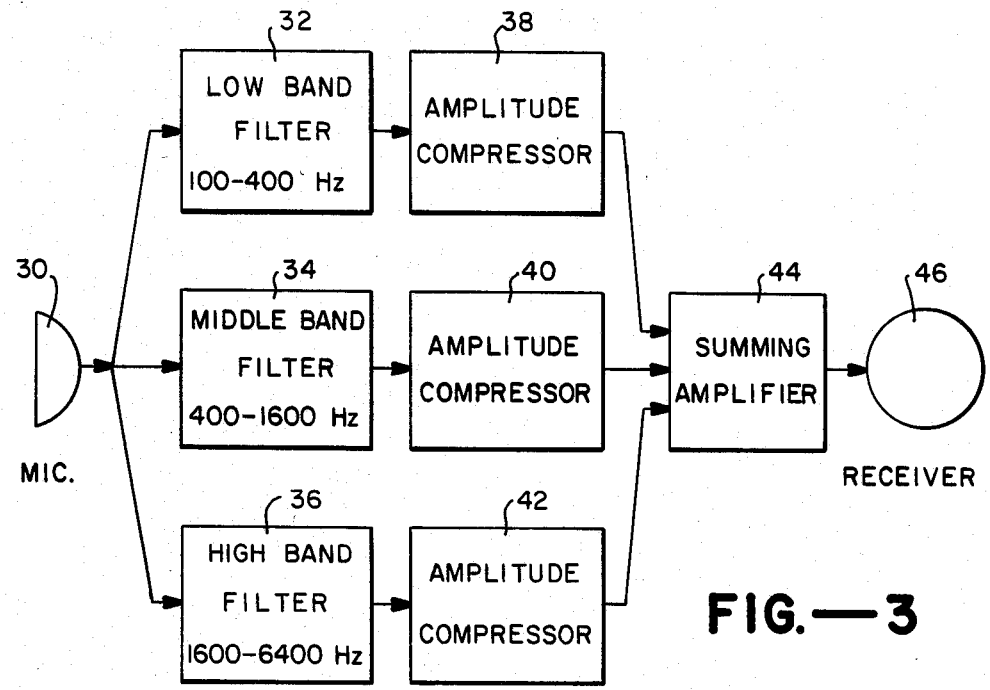
FIG.—3
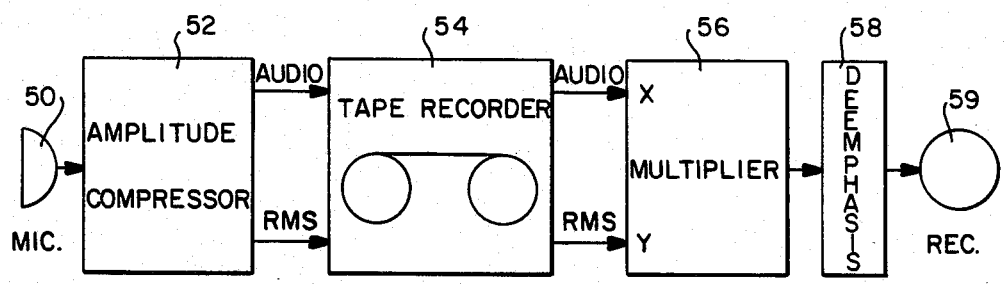
FIG.—4A
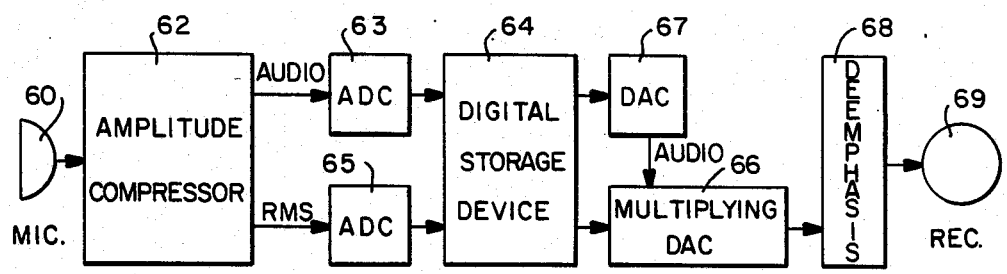
FIG.—4B

METHOD AND MEANS FOR PROCESSING SPEECH

This is a continuation of application Ser. No. 683,956 filed Dec. 19, 1984, now abandoned, which is a continuation of Ser. No. 455,250 filed Jan. 3, 1983, now abandoned.

This invention relates generally to speech processing, and more particularly the invention relates to a method and means for amplifying speech, such as for the hard of hearing, without adversely affecting the signal intelligence thereof.

It is well recognized that persons having sensorineural hearing impairment generally have a very limited dynamic range, that is, very little difference between the intensity level of the softest speech of which they are aware (e.g. speech awareness threshold or SAT), the intensity level of speech which is most comfortable for them (most comfortable level or MCL), and the intensity at which speech becomes too loud to be tolerated (uncomfortable loudness level or UCL). It is generally agreed that it would be highly desirable to reduce the wide range of speech intensity levels to a more restricted range suitable for the sensorineural hearing impairment of each individual listener.

Speech compression systems are known which employ automatic gain control. However, prior art systems employing peak clipping and instantaneous compression produce harmonic distortion which tends to emphasize the stronger, low-frequency components of speech and obscures the higher frequencies. A comprehensive survey is presented by Braida et al in "Hearing Aids—A Review of Past Research on Linear Amplification, Amplitude Compression, and Frequency Lowering", American Speech-Language-Hearing Association, Rockville, Md., April 1979. This survey provides an extensive critical review of the compression literature in conjunction with a tutorial on compression concepts. The survey suggests that the lack of benefits from compression as shown in the survey literature reflects more a failure of researchers to adequately grasp the concepts and complexity of compression, in theory and implementation, rather than the potential benefit of amplitude compression itself.

It is recognized that the acoustical patterns of speech can be systemically analyzed in three primary time-domain components: (1) a fine-temporal pattern reflecting the spectral distribution of each brief acoustic segment, (2) a gross-temporal pattern reflecting the durations of the various acoustic segments based on changes in fine-temporal patterns, and (3) a time-varying amplitude pattern. The fine-temporal cues from segments of speech as short as five or ten milliseconds will often provide a listener with sufficient information to identify the place of articulation for consonants. Similarly, the gross-temporal pattern will often provide sufficient information regarding the manner of articulation, especially among the classes of fricatives, affricates and stop-plosives. The time-varying amplitude pattern, or "speech envelope", is the natural result of a speech production process but may convey mostly redundant information already conveyed by a gross-temporal pattern. Robinson and Huntington, in a talk before the Acoustical Society of America in April, 1973, recognized that conventional compression amplification introduces undesirable distortion when brief time constants are utilized, and reacts too sluggishly for longer time constants. A method was proposed in which the average power of the speech wave form over intervals of several tens of milliseconds is measured continuously and is used to determine the gain to be applied to the waveform at the center of each interval, with the resulting amplitude compressed signal being delayed by one-half the length of the averaging interval. Preliminary results from a computer simulation suggested that speech intelligibility could be improved by this process. However, further work was not undertaken by Robinson and Huntington to develop the process.

An object of the present invention is an improved method of processing speech to facilitate reception without distorting the intelligible content thereof.

Another object of the invention is apparatus for compressing speech patterns whereby the variations in time-varying amplitude pattern or envelope are minimized without adversely affecting the fine-temporal and gross-temporal patterns of the speech.

The present invention is directed to a method and apparatus for processing speech in which a time-varying averaged or root-mean-square (RMS) amplitude pattern is obtained and used to normalize the time-varying amplitude pattern of speech and provide a compressed speech pattern positioned between the speech awareness threshold and the uncomfortable loudness level, ideally at the listener's most comfortable level. Spectral shaping is employed to emphasize the high-frequency content. The invention can be implemented in a single channel or multi-channel system. Suitable microphone means is employed to pick up a speech pattern, and the speech pattern from the microphone is preamplified and then processed by a suitable shaping filter which emphasizes the high-frequency content thereof. The root-mean-square of the amplitude of the spectrally shaped signal is then determined over a specific time period, and the inverse of the root-mean-square is then used to modulate the spectrally shaped signal, thus producing a normalized amplitude. Importantly, the shaped signal is delayed for a sufficient time period to compensate for the time delay involved in the root-mean-square determination prior to the amplitude compression. The resulting signal is thus compressed and then adjusted to the desired hearing range with the spectral shaping providing a retention of the fine-temporal pattern and the gross-temporal pattern.

The invention and objects and features thereof will be more readily apparent from the following detailed description and appended claims when taken with the drawing, in which:

FIG. 1 is a functional block diagram of a single channel speech processing apparatus in accordance with one embodiment of the present invention.

FIG. 2 is a graph illustrating the compression of speech in accordance with the present invention.

FIG. 3 is a functional block diagram of a multi-channel embodiment of speech processing apparatus in accordance with the invention.

FIGS. 4A and 4B are functional block diagrams of a tape recording system in accordance with other embodiments of the invention.

Referring now to the drawings, FIG. 1 is a functional block diagram of a single channel speech processor in accordance with one embodiment of the invention which has been built using conventional, commercially available components. In this embodiment a microphone 10 having a broad frequency response (e.g. an electret microphone having a response of 10 Hertz to 10

K Hertz such as a Knowles EA 1934) picks up audio signals and transmits electrical signals to a preamplifier 12 having 26 dB of gain between 100 Hertz to 10 K Hertz. The amplified signal is then passed to high frequency emphasis circuity 14 (e.g. TI064 quad amplifier) which provides 6 dB/octave gain over the range from 100 Hertz to two kiloHertz and a flat response above two kiloHertz. An auxiliary input is provided at 16 whereby signals from a radio receiver, for example, can be applied to the high frequency emphasis circuitry 14.

The signal from circuitry 14 is then passed to an RMS detector 16 which provides the root-mean-square (or an approximation thereof) amplitude of the signal over a specific time window such as, for example, 12 milliseconds which corresponds approximately to a glottal period of speech. The signal from the high-frequency emphasis circuitry 14 is also provided to delay circuitry 18 having a delay equal to the time constant of the RMS detector 16. In one embodiment the RMS detector comprised an analog series AD 536DA and the delay circuitry 18 comprised a Reticon SAD 4096 bucket brigade device operated from a 80 kilohertz digital clock 20.

The delayed signal from the delay device 18 is then applied as the numerator in a divider circuit 20 (e.g. Analog Devices AD 535 precision divider) and the RMS amplitude of the delayed signal is applied to the divider 20 as a denominator. Accordingly, the output from the divider 20 is a delayed amplitude compressed signal which is applied to the receiver 22 (Knowles ED 1925).

FIG. 2 is a plot of the compressed output level in dB SPL for the signal applied to receiver 22 versus the input level in dB SPL of the signal from the microphone 10. For input levels below about 45 dB, the output level is attenuated. At an input level of 45 dB, the output level is compressed and maintained uniform at approximately 100 dB SPL which is the MCL level. The compression ratio remains at 10:1 or greater for input levels above 45 dB.

FIG. 3 is a multi-channel signal compression system in accordance with another embodiment of the invention in which signals are filtered and compressed in a plurality of frequency bands. In this embodiment signals from the microphone 30 are applied to a low band (100-400 hZ) filter 32, a middle band (400-1,600 Hz) filter 34, and a high band (1,600-6400 Hz) filter 36. Signals from each of the filters are passed to amplitude compressor circuitry 38, 40, and 42. Each of the compressor circuits includes delay circuitry, RMS detector circuitry, and divider circuitry as illustrated in FIG. 1. Because each channel includes a narrow band of frequencies, the high frequency emphasis circuitry of FIG. 1 is not required. The compressed signals are then applied to a summing amplifier 44 with the composite summed signal then applied to the receiver 46.

FIGS. 4A and 4B are functional block diagrams of other embodiments of the invention useful with tape recorders and in which the compressed signal and the detected RMS value are both recorded in time sequence with a tape recorder. In FIG. 4A signals from the microphone 50 or other audio source are applied to amplitude compressor 52 which may be a single channel device as in FIG. 1 or a multiple channel device as in FIG. 3. The compressed audio signal is then recorded in an analog channel of the tape recorder 54, and the detected RMS value is recorded in an FM channel of the recorder 54. Thereafter, the recorded compressed audio signal and the recorded RMS value can be applied to a multiplier 56 from which the original audio signal and the original dynamic range is produced. The resulting decompressed signal is applied through frequency de-emphasis circuit 58 to the receiver 59.

FIG. 4B is a sampled digital recording system similar to the analog system of FIG. 4A. In this embodiment signals from microphone 60 are applied to the amplitude compressor 62, as in FIG. 4A, and then the compressed audio signal and the RMS value are converted to digital form by analog to digital circuits 63 and 65. The digital signals are then stored in digital recorder 64. The recorded signals are converted back to analog signals by digital to analog converter 57 and multiplying DAC 66. The decompressed signals from DAC 66 are frequency de-emphasized at 68 and then applied to the receiver 69.

These embodiments of the invention are particularly advantageous since tape recorders typically have a limited dynamic range. Thus, by recording the compressed audio signal and the RMS on the recorder, the full dynamic range of the recorded signal can be reconstructed in the multiplier 56 and multiplier 66.

In the preferred embodiments described herein, an RMS detector has been employed. However, other measures of the signal amplitude over a period of time, including an average value and an approximation of the RMS value, can be employed. As used herein, RMS value includes suitable approximations thereof. Further, while a divider has been employed in the preferred embodiments for obtaining the compressed signal, a logarithmic measure of the detected RMS or averaged value can be employed for obtaining the compressed value.

The invention has broad applications including, for example, hearing aids and audio storage media (as described herein), sampled digital storage system, broadcast systems, public address systems, and general voice communication including telephones. The invention is especially useful for communication in a noisy environment and through a noisy communication link such as in field applications.

Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. Apparatus for enhancing speech comprising
    microphone means for receiving audio signals and generating electrical signals in response thereto,
    high-frequency emphasis means connected to said microphone means for amplifying said electrical signals and providing spectrally shaped electrical signals,
    amplitude detection means connected to said high-frequency emphasis means for receiving said spectrally shaped electrical signals and obtaining a root-mean-square (RMS) amplitude of said spectraly shaped electrical signals over a selected period of time corresponding approximately to a glottal period of speech,
    delay means connected to said high-frequency emphasis means for receiving and delaying said spectrally shaped electrical signals for said selected period of time corresponding approximately to a glottal period of speech, and signal compression means connected to said delay means and to said amplitude detection means and including divider means for dividing a delayed spectrally shaped electrical signal by the root-mean-square amplitude of said delayed spectrally shaped electrical signal and thereby compressing the delayed spectrally shaped electrical signal by a ratio of at least 10:1 in accordance with said root-mean-square average value whereby a constant amplitude output signal without significant signal distortion is obtained for each segment of speech.

* * * * *